(12) United States Patent
Su et al.

(10) Patent No.: US 6,828,251 B2
(45) Date of Patent: Dec. 7, 2004

(54) METHOD FOR IMPROVED PLASMA ETCHING CONTROL

(75) Inventors: Yi-Nien Su, Koohsiung (TW); Jen-Cheng Liu, Hsin-chu (TW); Li-Chih Chaio, Yang-mei (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 174 days.

(21) Appl. No.: 10/077,720

(22) Filed: Feb. 15, 2002

(65) Prior Publication Data

US 2003/0155329 A1 Aug. 21, 2003

(51) Int. Cl.[7] .......................................... H01L 21/3065
(52) U.S. Cl. ....................... 438/724; 438/725; 438/726; 438/744; 216/67; 216/79
(58) Field of Search ............. 216/67, 79; 438/724–725, 438/726, 744

(56) References Cited

U.S. PATENT DOCUMENTS

| | | | | |
|---|---|---|---|---|
| 5,843,847 A | * | 12/1998 | Pu et al. ..................... | 438/723 |
| 6,060,400 A | * | 5/2000 | Oehrlein et al. ............ | 438/706 |
| 6,346,474 B1 | * | 2/2002 | Liu ............................. | 438/633 |
| 6,376,382 B1 | * | 4/2002 | Chiou et al. ................ | 438/696 |
| 6,383,919 B1 | * | 5/2002 | Wang et al. ................ | 438/638 |
| 6,495,469 B1 | * | 12/2002 | Yang et al. ................ | 438/725 |
| 2003/0087518 A1 | * | 5/2003 | Chen et al. ................. | 438/637 |

FOREIGN PATENT DOCUMENTS

JP           06163471 A   *  6/1994       ......... H01L/21/302

OTHER PUBLICATIONS

Li, Y.X. et al "Selective reactive ion etching of silicon nitride over silicon using CHF3 with N2 addition" JVSTB 13 (5) 2008–2012, Sep./Oct. 1995.*

* cited by examiner

Primary Examiner—Anita Alanko
(74) Attorney, Agent, or Firm—Tung & Associates

(57) ABSTRACT

A method for plasma etching is disclosed with improved etching selectivity for a nitride containing DARC and a low-k dielectric layer. Plasma chemistry is controlled by adjusting a nitrogen to oxygen ratio to achieve improved etching selectivity in both nitride containing and low-k dielectric layers. Nitrogen to oxygen ratios are adjusted to control etching of for example, a DARC nitride containing layer, and Carbon to fluorine ratios are additionally adjusted to control etching in a low-k dielectric layer.

12 Claims, 1 Drawing Sheet

METHOD FOR IMPROVED PLASMA ETCHING CONTROL

FIELD OF THE INVENTION

This invention generally relates to a method for etching vias and hole contact structures for semiconductor device manufacturing and more particularly to methods for plasma etching with improved etching selectivity for low-k materials and nitride containing dielectric anti-reflective coatings.

BACKGROUND OF THE INVENTION

During the formation of semiconductor devices it is often required that the conductive layers be interconnected through holes in the insulating layer. Such holes are commonly referred to as contact holes, i.e., when the hole extends through an insulating layer to an active device area, or vias, i.e., when the hole extends through an insulating layer between two conductive layers. The profile of a hole is of particular importance since that it exhibits specific electrical characteristics when the contact hole or via is filled with a conductive material. Typically, the holes are high aspect ratio holes, meaning that the ratio of length to width is at least greater than about 1. Such holes are typically formed by a plasma etch process where complex chemical processes result in relatively higher etching rates in one direction versus another, known as anisotropic etching. The relative anisotropicity of the etching process will in turn determine the etching profile of a etched hole. As semiconductor structures are inevitably driven to smaller sizes, successful etching of higher aspect ratio holes is becoming more difficult.

Plasmas in a plasma etch process containing fluorocarbons or hydrofluorocarbons selectively etch oxides relative to underlying silicon containing layers. For example, plasmas containing fluorocarbons or hydrofluorocarbons such as $CF_4$ and $CHF_3$ have been used to perform such an etch. Using fluorocarbon or hydrofluorocarbon containing plasmas provides a means of selectively etching oxide films against an underlying silicon containing layer, i.e., the etching of the oxide film down to the underlying silicon layer without significantly etching the underlying silicon containing layer. Accordingly, a high oxide to silicon etch rate ratio is required.

The key mechanisms responsible for high silicon dioxide to silicon etch rate selectivity in fluorocarbon plasmas involve the combination of at least two factors. First, the deposition of nonvolatile residue, e.g., a polymeric carbon containing residue, on various surfaces during the etching process acting to slow the relative etching rate on those surfaces, and second, oxygen from the etching of an oxide which acts to reduce residue deposition thereby increasing an etching rate on that surface. While carbon containing residues are found to deposit on all surfaces inside an etch chamber containing fluorocarbon or hydrofluorocarbon plasmas, less accumulation is observed to occur on oxide surfaces, e.g., doped silicon dioxide, than on non-oxide surfaces, e.g., silicon containing surfaces such as silicon nitride, doped silicon, or polysilicon.

Carbon containing residues or polymeric residues deposit on surfaces in a hole (e.g., sidewalls, hole bottom) when fluorocarbon plasmas are present due to a variety of mechanisms. For instance, fluorocarbon radicals dissociate upon being absorbed on a surface. Less residue accumulates on silicon dioxide surfaces because some of the carbon combines with the oxygen of the oxide being etched to form volatile carbon monoxide or carbon dioxide. The relatively clean surface allows the silicon dioxide layer to be etched at a faster rate compared to surfaces where polymeric carbon residues have deposited.

Further, when using fluorocarbon or hydrofluorocarbon containing plasmas, if the etching mechanism proceeds strictly by the reaction of silicon with fluorine atoms generated by the plasma to form $SiF_4$, isotropic rather than anisotropic etching occurs thereby providing no advantage over wet etching methods in forming contact holes or vias. Plasmas, however, generated using fluorocarbons or hydrofluorocarbons proceed by an anisotropic etch mechanism which is believed to depend on the manner of the bombardment of the etched surface with energetic ions.

For example, in a typical silicon dioxide etching process, to provide a contact hole or via on a wafer, incident energetic particles generally arrive in a direction perpendicular to the wafer surface, striking the bottom surfaces of the etched features. In anisotropic etching processes, such as those using fluorocarbon or hydrofluorocarbon containing plasmas, polymer deposition on the sidewalls and bottom surface of the contact hole or via being etched occurs simultaneously with the etching of the oxide. Surfaces struck by the ions at a lower rate tend to remove the nonvolatile polymeric residual layer at a lower rate, thereby at steady state, leaving a layer of nonvolatile polymeric residue on surfaces such as the sidewalls of the etched opening, thereby protecting such surfaces against etching by the reactive gas. As such, etching is performed preferentially in a direction perpendicular to the wafer surface since the bottom surfaces etch at a higher rate than the polymeric residue containing sidewalls (i.e., anisotropic etching).

However, an "etch stop" phenomenon with respect to high aspect ratio features, such as contact holes and vias, is problematic. For example, during the etching of a contact hole or via, a nonvolatile polymeric residual layer may be formed on the sidewalls and bottom surface of the contact hole or via from carbon containing neutral species resulting from the etch process. Deposition of the polymeric residual layer and etching of the oxide layer occur simultaneously. When high aspect ratio features are etched, the etch rate and etch chemistry vary with the aspect ratio and etching depth of the feature. Often the etching process begins normally until the etching depth reaches a particular depth or aspect ratio at which point the etching process undesirably stops, i.e., "etch stop" phenomenon.

Therefore, a major problem in etching high aspect ratio contact holes and vias in oxides is that the etch chemistry changes with changing aspect ratio (depth) of the etched hole resulting in premature etch stop. This effect is most severe in the oxide contact hole and via etch processes because of the need to use a chemistry in which the etching of the oxide and the deposition of a polymeric residual material are taking place simultaneously. Because of the polymer deposition, the etch process may stop spontaneously well before the desired oxide is etched to a desired depth, i.e., etch stop.

Another issue compounding the problem of etching of small high aspect ratio holes is the use of low-k (low dielectric constant) materials in various parts of semiconductor devices. For instance, in a damascene structure with an inter-metal dielectric (IMD), it may be advantageous to use lower dielectric constant materials in order to reduce signal delay times as semiconductor structures become smaller and smaller, for instance below 0.13 micron. The problem of signal delay increases as semiconductor dimensions decline requiring the use of lower k materials. Some of the newer low-k materials (or ultra low-k materials) frequently include carbon based materials such as Si—C, Si—$CH_3$, etc., as a result of methods used to make low-k materials by increasing the material porosity. The term low-k materials herein refers to materials with a dielectric constant of between about 2.0 and 3.0. Due to the presence of carbon containing materials in low-k materials, polymeric residual material tends to form at a higher rates during the etching process on the sidewalls and hole bottoms compared to higher k carbon-free materials such as silicon dioxide, thereby changing the etching chemistry and leading to premature etch stop. It would therefore be advantageous to develop an etching process whereby the formation of polymeric residue can be controlled to avoid the etch stop phenomenon during the etching process of for example, low-k materials.

Attempts to employ a cleaner etching chemistry (less deposition of polymeric residue) such as using higher oxygen concentrations have proven unsuccessful in that such chemistry in turn leads to undesirable photoresist selectivity (high photoresist etching rates) especially where a dielectric anti-reflective coating (DARC) overlying a low-k IMD layer must first be etched. A DARC layer is typically used to minimize the exposure of photoresist by reflected light during the photomasking process to define, for example, the via holes. The DARC layer must first be etched through prior to etching, for example, a low-k IMD material. Increasing the oxygen concentration to minimize polymer deposition during etching leads to poor photoresist selectivity in that the etching rate of the photoresist is undesirably high compared to the etching rate of, for example, the DARC or the low-k material of the IMD. Since DARC layers frequently include nitride materials, it would be advantageous to develop an etch chemistry whereby selectivity to etching of nitride materials is enhanced while etching of the photoresist is minimized in addition to minimizing the buildup of polymer materials at the bottoms of etch holes in either the DARC or the low-k IMD layer thereby avoiding the phenomenon of etch stop while maintaining an anisotropic etch.

There is therefore a need to develop new chemistry solutions in plasma etching as semiconductor structures are driven to smaller sizes, for example below 0.13 micron that will allow improved etching performance such as maintaining uniform etching profiles by controlling etching selectivity while avoiding the phenomenon of etch stop.

It is therefore an object of the invention to overcome some of the problems in plasma etching chemistry presented by the requirements imposed by decreasing structure size such as decreasing high aspect ratio hole size, thinner photoresist layers, and the use of low-k materials.

SUMMARY OF THE INVENTION

To achieve the foregoing and other objects, and in accordance with the purposes of the present invention, as embodied and broadly described herein, the present invention provides a method for controlling the selectivity of a plasma etch in a semiconductor manufacturing process.

In the first embodiment according to the present invention is provided a method including providing a low dielectric constant material including at least one layer of a nitride containing material; providing a photoresist layer overlying the at least one layer of a nitride containing material said photoresist layer photolithographically patterned for an etching process; providing an ambient conducive to forming a plasma including at least nitrogen and at least one compound selected from the group consisting of fluorocarbons and hydrofluorocarbons; forming a plasma in the presence of microwave power; and, adding oxygen and adjusting a nitrogen to oxygen ratio whereby the nitride material is preferentially etched through a thickness to form an etch opening.

In a related embodiment, the nitrogen to oxygen ratio is at least about 5.

In a related embodiment, the nitride containing material includes a dielectric anti-reflective coating (DARC) layer and may include at least one of the compounds silicon nitride, silicon oxynitride, and titanium nitride.

In other related embodiments, a polymer layer comprising CN is deposited on at least a sidewall of an opening defined by the etch opening and the photoresist opening. Additionally, the ambient may further include hydrogen. Further, a critical dimension (CD) bias is adjusted by altering the concentration of oxygen in the ambient. More particularly, a nitrogen flow rate is from about 50 to about 300 sccm, an oxygen flow rate is from about 2 to about 10 sccm, at least one of a fluorocarbon and hydrofluorocarbon flow rate is from about 20 to about 100 sccm, and the process is carried out at a pressure is from about 40 to about 100 millitorr. Further yet, the microwave power is supplied at a power level of from about 1000 to about 1500 Watts.

In a related embodiment, a polymer layer comprising CN is deposited on at least a sidewall of an opening defined by the etch opening and the photoresist opening thereby preferentially etching a bottom portion of the etch opening.

In the second embodiment according to the present invention is provided A method for plasma etching with improved etching selectivity for a dielectric material layer including providing a dielectric material layer over an nitride containing underlayer; providing a photoresist layer overlying the dielectric material layer; defining a pattern in the photoresist layer such that a portion of the dielectric material layer is exposed for etching according to a photolithographic process; providing an ambient conducive to forming a plasma including at least nitrogen and at least one compound selected from the group consisting of fluorocarbons and hydrofluorocarbons; forming a plasma in the presence of microwave power; and, adjusting a fluorine to carbon ratio whereby the dielectric material layer is preferentially etched through a thickness of said dielectric material layer.

In related embodiments, the fluorine to carbon ratio is adjusted within a range of about 2 to about 3. Further, the dielectric material layer includes a carbon containing material. More particularly, the dielectric material layer has a dielectric constant of at most about 3.0. Further, the nitrogen to oxygen ratio is preferably at least about 10. Further yet, an amount of oxygen is preferably added such that the amount of oxygen represents about a lower limit at which a critical dimension adjustment can be effected. More particularly, the nitrogen to oxygen ratio is adjusted to at least about 10 for etching through the dielectric material layer.

In related embodiments, preferred processing variables are recited including providing an ambient with a pressure from about 40 to about 60 millitorr; supplying microwave power at a power level of from about 1000 to about 1800 Watts; flowing nitrogen at a flow rate from about 150 to about 300 sccm; flowing oxygen at a flow rate from about 2 to about 10 sccm; and, flowing at least one of a fluorocarbon and hydrofluorocarbon at a flow rate from about 5 to about 15 sccm.

A third embodiment according to the present invention, includes providing a substantially oxygen free ambient prior to completely etching through the dielectric material layer into the nitride containing underlayer.

These and other related embodiments according to the present invention will become clear as further presented in greater detail in the Detailed Description of the Preferred Embodiments below.

DETAILED DESCRIPTION OF THE PREFERRED EMBODIMENTS

The present invention will now be described in detail with reference to a few illustrative embodiments thereof as shown in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1A:
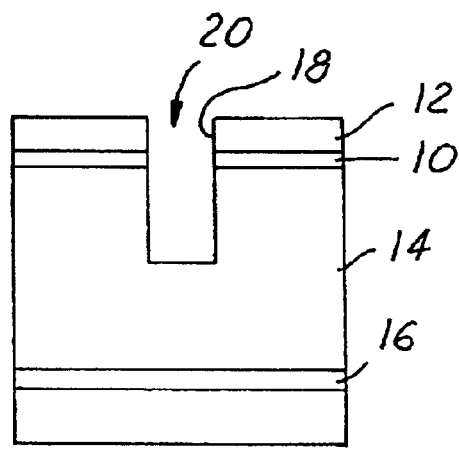
FIGS. 1A–1C are cross-sectional views of different stages of a plasma etching process in a representative semiconductor structure.
Figure 1B:
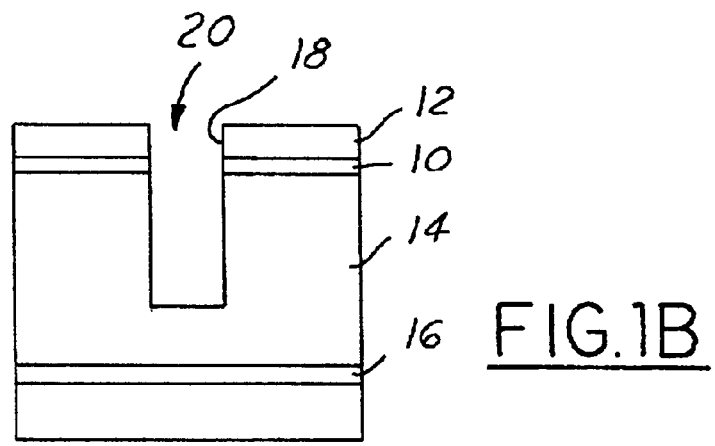
Figure 1C:
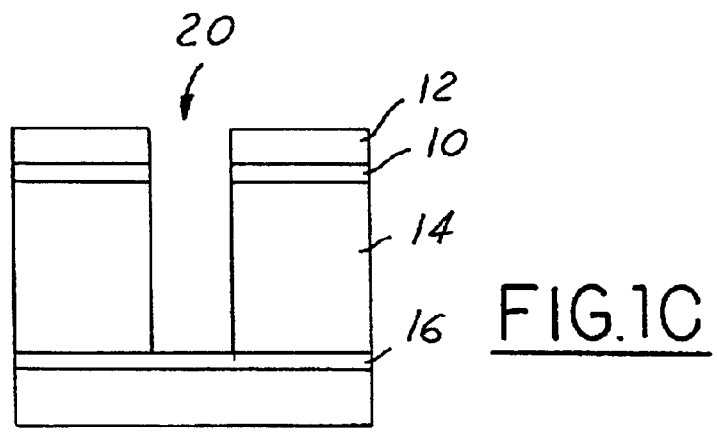

FIG. 1A through 1C show a series of steps performed to complete an etching process in a semiconductor structure, for example, a via or contact hole. In FIGS. 1A through 1C is depicted a photoresist layer 12 overlying a DARC layer 10, followed by a low-k material 14 and finally an etching stop layer 16. In FIGS. 1A through 1C is represented the etching of, for example, a via hole 20 where the low-k material 14 is for example, an inter-metal dielectric (IMP). As shown in FIG. 1A, an etching process with a chemistry that is capable of selectively etching an inorganic dielectric anti-reflective coating (DARC) layer is required in the first step. The DARC is preferably a nitride containing material and more preferably, at least one of silicon nitride, silicon oxynitride, and titanium nitride. The DARC may also be a low-k carbon containing dielectric material layer.

According to the prior art, nitrogen was present at relatively low levels in the ambient for producing a plasma i.e., a dilute reaction gas typically with minimal flow rates of about 10–20 sccm. In contrast, according to the present invention, it has been unexpectedly found that a higher nitrogen containing ambient, for instance, in the range of about 50 to 300 sccm, and a nitrogen to oxygen ratio of at least 5 gave superior results for etching via and contact holes especially in smaller dimensional semiconductor structures of 0.13 microns and below.

For instance, for the first etching step as shown in FIG. 1A where the DARC is first etched through it has been found that fluorocarbons or hydrofluorocarbons represented herein as $C_xF_y$ containing a nitrogen to oxygen ratio of at least 5 had a good etching selectivity of the DARC layer 10 (e.g., SiON) to the photoresist 12.

While not wishing to be bound by the following explanation, it is believed that the improved selectivity is due to the deposition of a cyanide (CN) containing polymeric compound on the sidewalls 18 of the photoresist opening and etch hole 20, thereby protecting the photoresist and leading to improved (high aspect ratio) anisotropic etching results. Further, it is believed that the nitrogen acts to keep the hole bottom of the etch hole relatively clean thereby avoiding etch stop which tends to occur in the presence of too much oxygen. It has been found that increasing the oxygen concentration in the ambient results in poorer selectivity with residual polymeric carbon buildup at the hole bottoms leading to etch stop.

Further, it has been found that etching results were also improved with the presence of hydrogen. It has additionally been found that while good etching results may be obtained in the absence of oxygen, it is desirable to have a small amount of oxygen present in order to adjust etching profiles or critical dimension bias. For instance, during etching, one material, e.g., photoresist, may have a higher plasma etching rate than another material, e.g., silicon oxynitride (SiON). Since increasing the amount of oxygen may, for example, slow the etching rate of the photoresist compared to SiON, a small adjustment of the oxygen concentration allows one to control preferential etching or critical dimension bias at the interfaces of layers of different materials. Consequently, a minimal amount of oxygen representing a lower limit at which critical dimension bias may be adjusted is preferable. The nitrogen to oxygen ratio is therefore an important factor in achieving improved etching according to the present invention.

As a representative process for etching a DARC layer, it has been found that suitable pressures for etching the DARC layer are from about 40 to about 100 millitorr. Suitable levels of microwave power supplied to the plasma are from 1000 to about 1500 Watts. A fluorocarbon such as $CHF_3$ provides a suitable fluorine to carbon ratio (3) and is preferably supplied with a flow rate from about 20 to about 100 sccm (standard cubic centimeters). Further, a nitrogen flow rate is preferably supplied at a flow rate from about 50 to about 300 sccm with an oxygen flow rate from about 2 to about 10 sccm.

FIG. 1B shows an example of a typical second step in an etching process after etching through a DARC layer as shown in FIG. 1. In a second step of a plasma etching process as shown in FIG. 2, a dielectric material (IMD) 14 which is preferably a low-k (low dielectric constant) material is etched. By low dielectric constant material is defined herein to mean a dielectric constant of about 2.0 to about 3.0. The term "about" is further defined herein to mean within 10 percent of the value recited.

As explained in the background of the invention, as structure size decreases, the desirability of using lower k materials increases. Similar to etching the DARC layer, it has been found that a high nitrogen level in the ambient is likewise beneficial to etching low-k materials. It has been found that nitrogen flow rates of about 100 sccm to about 300 sccm with a nitrogen to oxygen ratio of at least about 10 gives good etching results according to the present invention. As with DARC etching, it has been found that etching may proceed with unexpectedly improved results with high nitrogen to oxygen ratios and even in the absence of oxygen. However, it has also been found that the presence of some oxygen is preferable in that control of critical dimension bias may be effected.

It has additionally been found that adjustment of a carbon to fluorine ratio (or a fluorine to carbon ratio) by altering the x and y in $C_xF_y$ by the selection of appropriate hydrofluorocarbons or mixtures thereof, may be advantageous in the etching of a low-k dielectric material. For instance, it has been found that improved etching results are achieved when prior to beginning etching of the low-k material, the carbon to fluorine ratio is increased (i.e., the fluorine to carbon ratio decreased) compared to the DARC etching step. While not wishing to be bound by the following explanation, it is believed that the increased carbon to fluorine ratio improves selectivity by providing a carbon rich environment leading to increased residual polymeric carbon deposition on the etch hole sidewalls, thereby improving etching selectivity with respect to the hole bottom. It will be apparent to one skilled in the art that the optimal ratio will depend on the various parameters of a particular process.

As a representative process for etching a low-k layer, it has been found that suitable pressures for the etching process are from about 40 to about 60 millitorr. Suitable levels of microwave power supplied to the plasma are from 1000 to about 1800 Watts. Fluorocarbons such as $C_4F_0$, $C_5F_8$, or $C_4F_6$, or a mixture thereof is provided at an increased carbon to fluorine ratio of at least about ½ (i.e. a decreased suitable fluorine to carbon ratio of at least about 2) is preferably supplied with a flow rate from about 5 to about 15 sccm. Further, a nitrogen flow rate is preferably supplied from about 150 to about 300 sccm with an oxygen flow rate from about 2 to about 10 sccm.

Turning to FIG. 3c, a third step in an etching process is depicted whereby etching is continued through the low-k dielectric layer 14 to an etch stop layer 16 or what is commonly known in the art as an over-etching step. For this process it has been found that for the final period of etching, whereby the low-k dielectric layer 14 is etched through to the underlying etch stop layer 16, it is preferable if no oxygen is present in the ambient plasma etch as it has been found that etching selectivity for the etch stop layer is diminished. Thus, it is preferable according to the present invention that etching through the final part of the low-k dielectric layer 14 is carried out in the absence of oxygen.

While the embodiments illustrated in the Figures and described above are presently preferred, it should be understood that these embodiments are offered by way of example only. Other embodiments may include, for example, different nitrogen to oxygen ratios or different fluorine to carbon ratios that achieve substantially the same results in substantially the same way. The invention is not limited to a particular embodiment, but extends to various modifications, combinations, and permutations that nevertheless fall within the scope of the appended claims.

What is claimed is:

1. A method for plasma etching with etching selectivity for a low-K carbon containing dielectric material layer and underlying etch stop layer comprising the steps of:
   providing a substrate comprising a low-K carbon containing dielectric material layer overlying a nitride containing etch stop underlayer;
   providing a photoresist layer overlying the low-K carbon containing dielectric material layer;
   defining a pattern comprising the photoresist layer such that a portion of the low-K carbon containing dielectric material layer is exposed for etching; and,
   carrying out a first plasma etching process by introducing a gas comprising fluorocarbons, nitrogen, and oxygen at a nitrogen to oxygen ratio of at least about 10 and a fluorine to carbon ratio within a range of about 2 to about 3 into the etch chamber to etch through a thickness portion of the low-K carbon containing dielectric material layer.

2. The method of claim 1, wherein the low-K carbon containing dielectric material layer has a dielectric constant of at most about 3.0.

3. The method of claim 1, wherein the first plasma etching process comprises a pressure from about 40 to about 60 millitorr.

4. The method of claim 1, wherein the first plasma etching process comprises supplying microwave power at a power level of from about 1000 to about 1800 Watts.

5. The method of claim 1, further comprising the steps of:
   supplying nitrogen at a flow rate from about 150 to about 300 sccm; and,
   supplying oxygen at a flow rate from about 2 to about 10 sccm; and,
   supplying at least one hydrofluorocarbon at a flow rate from about 5 to about 15 sccm.

6. The method of claim 1, further comprising a second plasma etching process wherein oxygen is not provided during etching through the nitride containing underlayer.

7. The method of claim 1, wherein the fluorocarbon is selected from the group consisting of $C_4F_0$, $C_5F_8$, or $C_4F_6$, and mixtures thereof.

8. A method for plasma etching a via opening with nitride and low-K carbon containing IMD layer etching selectivity with respect to a photoresist layer comprising the steps of:
   providing a substrate comprising a low-K carbon containing IMD layer including an overlying nitrogen containing dielectric anti-reflective coating (DARC) layer and an underlying etch stop layer;
   forming and patterning a photoresist layer overlying the DARC layer;
   carrying out a first plasma etching process by introducing a gas consisting essentially of hydrogen containing fluorocarbons, nitrogen, and oxygen at a nitrogen to oxygen ratio of at least about 5 into the etch chamber to etch through a thickness of the DARC layer;
   carrying out a second plasma etching process comprising hydrogen containing fluorocarbons, nitrogen, and oxygen at a nitrogen to oxygen ratio of at least about 10 to etch and a fluorine to carbon ratio within a range of about 2 to about 3 to etch through a thickness portion of the low-K carbon containing IMD layer; and,
   carrying out a third plasma etching process consisting essentially of hydrofluorocarbons and nitrogen to etch through a thickness of the etch stop layer.

9. The method of claim 8, wherein the DARC layer comprises silicon oxynitride.

10. The method of claim 8, wherein the low-K carbon containing IMD layer has a dielectric constant of at most about 3.0.

11. The method of claim 8 wherein the first plasma etching process comprises a nitrogen to oxygen ratio of about 5 to 1 to about 150 to 1.

12. The method of claim 8 wherein the second plasma etching process comprises a nitrogen to oxygen ratio of about 15 to 1 to about 150 to 1.

* * * * *